(12) United States Patent
Yamauchi

(10) Patent No.: US 6,838,349 B2
(45) Date of Patent: Jan. 4, 2005

(54) SEMICONDUCTOR DEVICE AND METHOD FOR FABRICATING THE SAME

(75) Inventor: Tsunenori Yamauchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 52 days.

(21) Appl. No.: 10/053,712

(22) Filed: Jan. 24, 2002

(65) Prior Publication Data

US 2003/0025114 A1 Feb. 6, 2003

(30) Foreign Application Priority Data

Jul. 31, 2001 (JP) ........................................ 2001-232561

(51) Int. Cl.[7] ............................................ H01L 21/331
(52) U.S. Cl. ........................ 438/350; 257/197; 257/592
(58) Field of Search ................................ 438/312, 350, 438/933; 257/19, 197, 592, 515

(56) References Cited

U.S. PATENT DOCUMENTS 5,001,533 A * 3/1991 Yamaguchi ................. 257/515
6,387,768 B1 * 5/2002 Sakamoto ................... 438/367
6,537,369 B1 * 3/2003 Saitoh ............................ 117/3

* cited by examiner

*Primary Examiner*—Alexander Ghyka
(74) *Attorney, Agent, or Firm*—Armstrong, Kratz, Quintos, Hanson & Brooks, LLP

(57) ABSTRACT

The semiconductor device comprises a first semiconductor layer 14 formed on a semiconductor substrate 10; an outgoing base electrode 26 formed on the first semiconductor layer 14; a base layer 32 formed on the first semiconductor layer, connected to the outgoing base electrode at a side surface of the outgoing base electrode, and formed of silicon germanium containing carbon; and a second semiconductor layer 36 formed on the base layer. The base layer 32 of silicon germanium contains carbon, which prevents the action of interstitial silicon atoms, which are very influential to diffusion of boron. As a result, when the emitter layer 36, etc. are subjected to heat processing at, e.g., about 950° C., the diffusion of boron out of the base layer 32 can be prevented.

21 Claims, 11 Drawing Sheets

SEMICONDUCTOR DEVICE AND METHOD FOR FABRICATING THE SAME

BACKGROUND OF THE INVENTION

The present invention relates to a semiconductor device and a method for fabricating the semiconductor device, more specifically a semiconductor device using silicon germanium and a method for fabricating the semiconductor device.

Recently, HBT (Heterojunction Bipolar Transistor) using silicon germanium is noted as a device applicable to portable telephones, optical transmission, etc., which require extra-high frequency operations.

The proposed HBT will be explained with reference to FIGS. 10A to 11C. FIGS. 10A to 11C are sectional views of the proposed HBT in the steps of the method for fabricating the HBT, which show the method.

As shown in FIG. 10A, an n$^+$ type buried diffused layer 112 and an n type collector layer 114 are formed sequentially on a p type silicon substrate 110.

Then, a pad oxide film 118 is formed on the surface of the collector layer 114.

Next, an element isolation film 122 is formed by local oxidation. Then, the pad oxide film 118 in a collector 123 is removed.

Then, as shown in FIG. 10B, a polycrystal silicon layer 125 is formed on the entire surface. Next, boron is implanted in a part of the polycrystal silicon layer 125, which is to be an outgoing base electrode 126.

Then, an insulation film 128 of SiN is formed on the entire surface.

Next, an insulation film 129 of SiO$_2$ is formed on the entire surface.

Next, as shown in FIG. 10C, an opening 130 is formed down to the pad oxide film 118 by photolithography.

Next, an insulation film 131 of SiN is formed on the inside wall of the opening 130.

Then, as shown in FIG. 10D, with the insulation film 128 and the insulation film 131 as a mask, the pad oxide film 118, and the insulation film 129 on the insulation film 128 are selectively etched. At this time, the pad oxide film 118 immediately below the outgoing base electrode 126 is also etched.

Then, a shown in FIG. 11A, single crystal p type base layer 132 of silicon germanium is grown in a region where the collector layer 114 is exposed. A p type dopant implanted in the base layer 132 is boron.

Next, as shown in FIG. 11B, an insulation film 134 of SiO$_2$ and an insulation film 135 of SiN are formed sequentially on the inside of the opening 130 with the insulation film 131 formed on.

Then, an opening 137 is formed in the insulation film 135 and the insulation film 134 down to the base layer 132.

An n type emitter layer 136 is formed, connected to the base layer 132 through the opening 137.

Then, as shown in FIG. 11C, the polycrystal silicon layer 125 in the region except for the outgoing base electrode 126 is etched by photolithography.

Thus, the proposed HBT is fabricated.

Such HBT using silicon germanium is expected to realize high-speed operations of a 100 GHz cut-off frequency f$_T$.

However, in the proposed HBT described above, the boron is often diffused out of the base layer 132 by heat processing made after the emitter layer 136 has been formed. When the boron is diffused out of the base layer 132, a transit time of the carriers in the base layer 132 becomes longer, which leads to a lower cut-off frequency f$_T$.

In the proposed HBT, the growth of the base layer 132 immediately below the outgoing base electrode 126 is very unstable. Often voids occur. Accordingly, in the proposed HBT, the connection between the base layer 132 and the outgoing base electrode 126 is unstable, and a parasitic resistance between the base layer 132 and the outgoing base electrode 126 often becomes high. The parasitic resistance increase between the base layer 132 and the outgoing base electrode 126 results in increased noises.

Here, in order to make a parasitic resistance between the base layer 132 and the outgoing base electrode 126 low, it will be one means to side-etch much of the pad oxide film 118 immediately below the outgoing base electrode 126. However, it results in an increased parasitic capacitance between the base layer 132 and the collector layer 114, which much hinders high-speed operation of the HBT.

Under such circumstances, an HBT which can realize high-speed operation and can reduce noises is much expected.

SUMMARY OF THE INVENTION

An object of the present invention is to provide a semiconductor device having high operational speed and low noises, and a method for fabricating the semiconductor device.

According to one aspect of the present invention, there is provided a semiconductor device comprising: a first semiconductor layer formed on a semiconductor substrate; an outgoing base electrode formed on the first semiconductor layer; a base layer formed on the first semiconductor layer, connected to the outgoing base electrode at a side surface of the outgoing base electrode, and formed of silicon germanium containing carbon; and a second semiconductor layer formed on the base layer.

According to another aspect of the present invention, there is provided a semiconductor device comprising: a first semiconductor layer formed on a semiconductor substrate; an outgoing base electrode formed on the first semiconductor layer; a base layer formed on the first semiconductor layer, connected to the outgoing base electrode, and formed of silicon germanium containing carbon; and a second semiconductor layer formed on the base layer, the outgoing base electrode and the base layer are formed continuous to each other.

According to farther another aspect of the present invention, there is provided a method for fabricating a semiconductor device comprising the steps of: forming an outgoing base electrode with an opening formed in on a first semiconductor layer formed on a semiconductor substrate; and forming a base layer of silicon germanium containing carbon at least in the opening; and forming a second semiconductor layer on the base layer.

According to farther another aspect of the present invention, there is provided a method for fabricating a semiconductor device, comprising the steps of: forming a base layer of silicon germanium containing carbon and an outgoing base electrode connected to the base layer on a first semiconductor layer formed on a semiconductor substrate, the base layer and the outgoing base electrode being formed continuous to each other; and forming a second semiconductor layer on the base layer.

As described above, according to the present invention, the base layer of silicon germanium contains carbon, so that the diffusion of the boron out of the base layer can be prevented. According to the present invention, the base layer and the outgoing base electrode are connected at a part of the inside wall of the opening, whereby the base layer and the outgoing base electrode can be connected stable, and a parasitic resistance between the base layer and the outgoing base electrode can be small. According to the present invention, the pad oxide film immediately below the outgoing base electrode is a little side-etched, so that a parasitic capacitance between the base layer and the collector layer can be small. According to the present invention, an impurity is heavily implanted in the interface between the base layer and the outgoing base electrode, whereby a parasitic resistance between the base layer and the outgoing base electrode can be small. Thus, according to the present invention, the semiconductor device can have high operational speed and low noises.

DETAILED DESCRIPTION OF THE INVENTION

Figure 1:
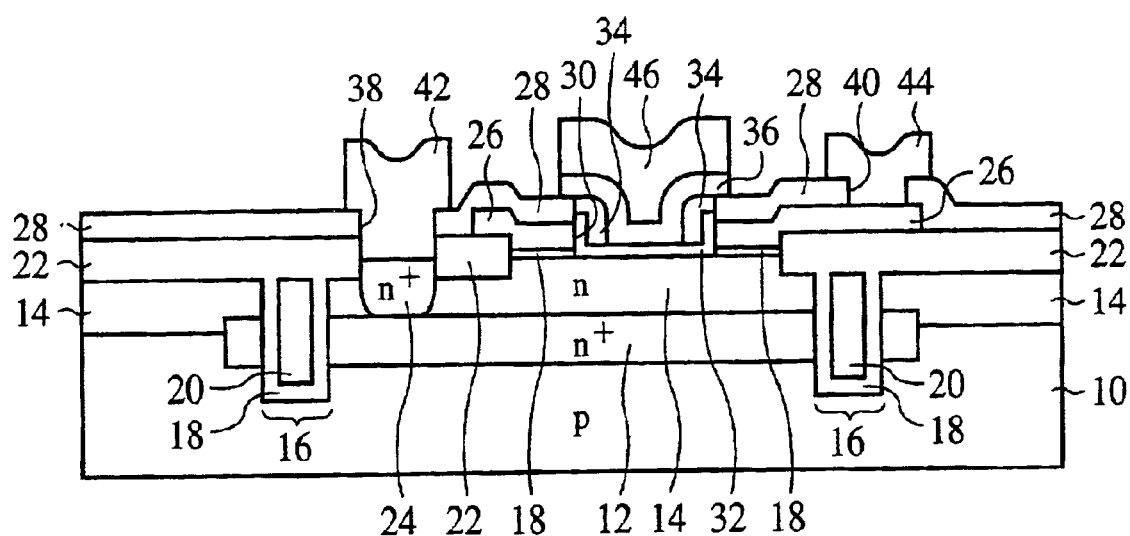
FIG. 1 is a sectional view of the semiconductor device according to one embodiment of the present invention.

The semiconductor device according to one embodiment of the present invention and the method for fabricating the semiconductor device will be explained with reference to FIG. 1. FIG. 1 is a sectional view of the semiconductor device according to the present embodiment. FIGS. 2A to 5B are sectional views of the semiconductor device according to the present embodiment in the steps of the method for fabricating the same, which explain the method.

(Semiconductor Device)

The semiconductor device according to the present embodiment will be explained with reference to FIG. 1.

As shown in FIG. 1, a buried diffused layer 12 of $n^+$ type As-doped silicon is formed on a (100) p type silicon substrate 10.

On the silicon substrate 10 with the buried diffused layer 12 formed on, an n type collector layer 14 of phosphorus-content silicon is formed by epitaxial growth.

A groove 16 is formed in the collector layer 14, the buried diffused layer 12 and the silicon substrate 10 deeper than the lower surface of the buried diffused layer 12. The groove 16 is for element isolation.

A pad oxide film 18 of a 100 nm-thickness silicon oxide film is formed on the collector layer 14 and on the inside surface of the groove 16.

A polycrystal silicon layer 20 is buried in the groove with the pad oxide film 18 formed on.

An element isolation film 22 is formed on the surface of the collector layer 14.

An $n^+$ type collector compensation diffused layer 24 is formed in the collector layer 14 down to the buried diffused layer 12.

An outgoing base electrode 26 of p type polycrystal silicon is formed on the pad oxide film 18 and the element isolation film 22.

An insulation film 28 of a silicon oxide film formed by CVD is formed on the entire surface.

An opening 30 is formed in the insulation film 28, the outgoing base electrode 26 and the pad oxide film 18 down to the collector layer 14. The side-etching amount of the pad oxide film 18 immediately below the outgoing base electrode 26 is limited to, e.g., below 0.1 $\mu$m.

A 150 nm-thickness p type base layer 32 of carbon-content silicon germanium is formed in the opening 30. As a p type dopant, boron is implanted in the base layer 32. The base layer 32 contains carbon to prevent diffusion of the boron from the base layer 32.

A concentration of carbon contained in the base layer 32 is set to be 0.01% to 6%. When a concentration of carbon contained in the base layer 32 is above 6%, the material of the base layer 32 becomes a material different from silicon germanium. On the other hand, when a concentration of carbon contained in the base layer 32 is below 0.01%, the carbon is too little to prevent diffusion of the boron from the base layer 32. Thus, according to the present embodiment, a concentration of carbon contained in the base layer 32 is set to be in a range of 0.01% to 6%.

The base layer 32 formed on the surface of the collector layer 14 is single-crystalline. A single-crystalline part, i.e., the base layer 32 grown on the surface of the collector layer 14 functions an intrinsic base region.

The base layer 32 formed on the side surfaces of the pad oxide film 18, the outgoing base electrode 26 and the insulation film 28 is polycrystalline. The part of the base layer 32, which is polycrystalline is projected beyond the upper surface of the outgoing base electrode 26 by, e.g., above 0.02 $\mu$m.

The interface between the base layer 32 and the outgoing base electrode 26 is heavily doped with a p type impurity. In other words, the part of the base layer 32 grown on the surface of the collector layer 14 has a higher impurity concentration than the part of the base layer 32, which is in contact with the outgoing base electrode 26. A p type impurity is heavily doped in the interface between the base layer 32 and the outgoing base electrode 26 is for the purpose of reducing a parasitic resistance between the base layer 32 and the outgoing base electrode 26 to realize low noises.

A sidewall insulation film 34 of a silicon oxide film is formed on the inside wall of the opening 30 formed in the base layer 32.

An emitter layer 36 of n type amorphous silicon is formed on the base layer 32 and the sidewall insulation film 34.

An opening 38 is formed in the insulation film 28 down to the collector compensation diffused layer 24. An opening 40 is formed in the insulation film 28 down to the outgoing base electrode 26.

A collector electrode 42 is formed on the insulation film 28, electrically connected to the collector compensation diffused layer 24 through the opening 38. A base electrode 44 is formed on the insulation film 28, electrically connected to the outgoing base electrode 26 through the opening 40. An emitter electrode 46 is formed on the emitter layer 36.

The semiconductor device according to the present embodiment has such structure.

One of major characteristics of the semiconductor device according to the present embodiment is that silicon germanium containing carbon is used as a material forming the base layer 32.

In the proposed HBT described above, the heat processing for the emitter layer 136, etc. often diffuses boron out of the base layer. When boron is diffused out of the base layer 132, with a result that a transit time of the carriers in the base layer 132 is long, which leads to low shut-off frequency $f_T$.

In the present embodiment, the base layer 32 of silicon germanium contains carbon, which prevents the action of interstitial silicon atoms, which are very influential to diffusion of boron. As a result, when the emitter layer 36, etc. are subjected to heat processing at, e.g., about 950° C., the diffusion of boron out of the base layer 32 can be prevented.

One of the major characteristics of the semiconductor device according to the present embodiment is that the base layer 32 and the outgoing base electrode 26 are in contact with each other at a part of the inside wall of the opening 30.

In the proposed HBT described above, the base layer 132 is grown immediately below the outgoing base electrode 126, and the base layer 132 and the outgoing base electrode 126 are electrically in contact with each other, which the electrical connection between the base layer 132 and the outgoing base electrode 126 is unstable. Accordingly, in the proposed HBT described above, a parasitic resistance between the base layer 132 and the outgoing base electrode 126 is often high, which often leads to noise increase.

In the semiconductor device according to the present embodiment, the base layer 32 and the outgoing base electrode 26 are in contact with each other at a part of the inside wall of the opening 30, whereby the base layer 32 and the outgoing base electrode 26 can be in stable contact with each other. Thus, according to the present embodiment, a parasitic resistance between the base layer 32 and the outgoing base electrode 26 can be low, which can lead to low noises.

One of the major characteristics of the semiconductor device according to the present embodiment is that the side-etching amount of the pad oxide film 18 immediately below the outgoing base electrode 26 is small.

In the proposed HBT described above, the pad oxide film 118 immediately below the outgoing base electrode 126 is much side-etched, and the base layer 132 is grown also in the region where the pad oxide film 118 has been side-etched. Accordingly, a parasitic capacitance between the base layer 132 and the collector layer 114 becomes large, which is a barrier factor to higher operational speed.

In the semiconductor device according to the present embodiment, a side-etching amount of the pad oxide film 18 immediately below the outgoing base electrode 26 is as small as, e.g., below 0.1 μm, which makes it possible to decrease an intrinsic base region. Thus, according to the present embodiment, a parasitic capacitance between the base layer 32 and the collector layer 14 can be made minimum, which makes higher-speed operation possible.

In the proposed HBT shown in FIGS. 10A to 11C, when a width of the opening 130 is 0.6 μm, and a side-etching amount immediately below the outgoing base electrode 126 is 0.2 μm, a width of the intrinsic base region is as large as 1.0 μm. In contrast to this, in the present embodiment, when a width of the opening 30 is 0.6 μm, a width of the intrinsic base region can be made as small as 0.6 μm. Thus, according to the present embodiment, a parasitic capacitance can be decreased to, e.g., below 50% in comparison with that of the proposed HBT described above.

One of the major characteristics of the semiconductor device according to the present embodiment is that an impurity is heavily doped in the interface between the base layer 32 and the outgoing base electrode 26.

In the proposed HBT described above, the base layer 132 is grown on the surface of the collector layer 114 immediately below the outgoing base electrode 126 to thereby electrically connect the base layer 132 and the outgoing base electrode 126, which has been made it difficult to make a parasitic resistance between the base layer 132 and the outgoing base electrode 126 small.

In the semiconductor device according to the present embodiment, an impurity is heavily doped in the interface between the base layer 32 and the outgoing base electrode 26, which allows a parasitic resistance between the base layer 32 and the outgoing base electrode 26 to be small. According to the present embodiment, a parasitic resistance between the base layer 32 and the outgoing base electrode 26 can be decreased, which can lead to low noises.

As described above, the semiconductor device according to the present embodiment can have high operational speed and low noises.

(Method for Fabricating the Semiconductor Device)

Then, the method for fabricating the semiconductor device according to the present embodiment will be explained with reference to FIGS. 2A to 5B.

Figure 2A:
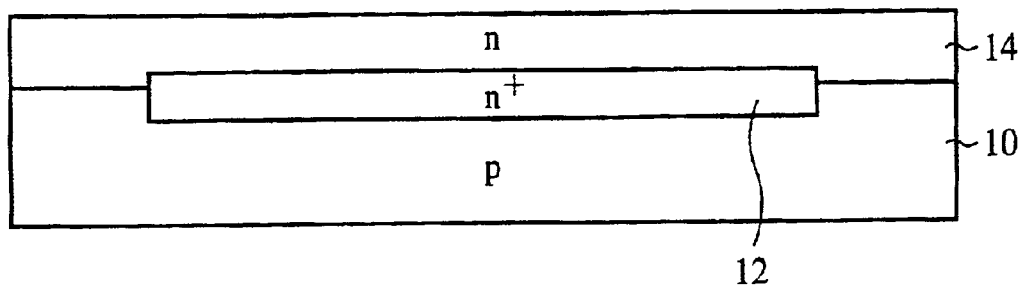
FIGS. 2A to 2C are sectional views of the semiconductor device according to the embodiment in the steps of the method for fabricating the semiconductor device, which show the method (Part 1).

As shown in FIG. 2A, an n⁺ type buried diffused layer 12 formed of a 1.5 μm-thickness As-doped silicon is formed on a (100) p type silicon substrate 10 by ion implantation.

Then, a silicon layer containing phosphorus is epitaxially grown on the entire surface by low-pressure CVD to form the n type collector layer 14 in a 1 μm-thickness.

Figure 2B:
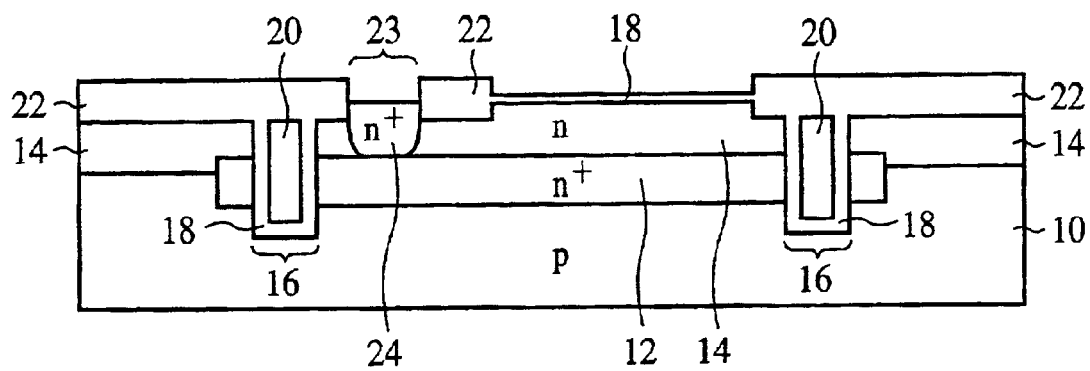

Then, as shown in FIG. 2B, the groove 16 is formed deeply beyond the buried diffused layer 12.

Next, the pad oxide film 18 of a 50 nm-thickness silicon oxide film is formed on the entire surface by thermal oxidation.

Then, the polycrystal silicon layer 20 is buried in the groove 16 with the pad oxide film 18 formed on the inside surface.

Next, the element isolation film 22 is formed by local oxidation.

Next, phosphorus is heavily implanted in a collector region 23 by ion implantation to thereby form the n+ type collector compensation diffused layer 24 down to the buried diffused layer 12. Conditions for the ion implantation are, e.g., 120 keV acceleration energy and a $1\times10^{15}$ cm$^{-2}$ dose.

Then, a 300 nm-thickness polycrystal silicon layer is formed on the entire surface by thermal CVD. The polycrystal silicon layer is for forming the outgoing base electrode 126.

Then, boron is introduced into the polycrystal silicon layer by ion implantation.

Next, the polycrystal silicon layer is patterned in a configuration of the outgoing base electrode 26. Thus, the outgoing base electrode 26 is formed.

Figure 2C:
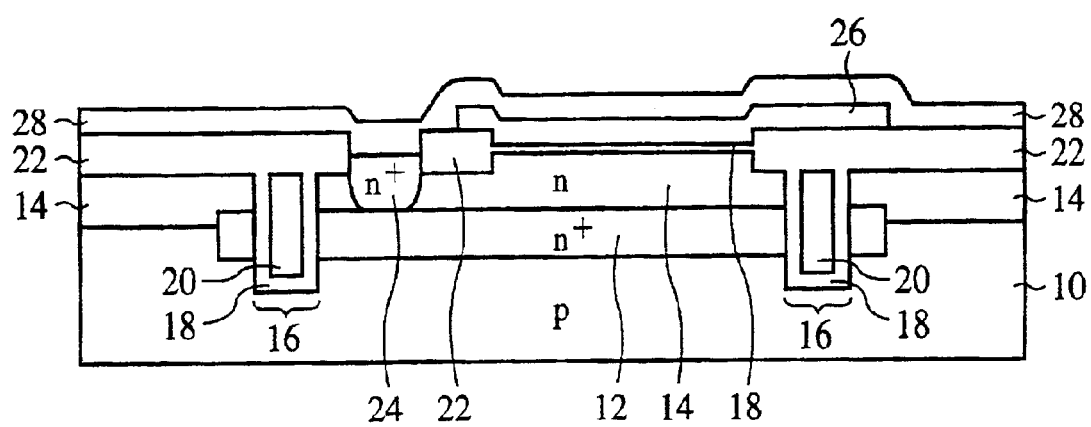

Then, the insulation film 28 is formed of a 300 nm-thickness silicon oxide film on the entire surface by CVD (see FIG. 2C).

Figure 3A:
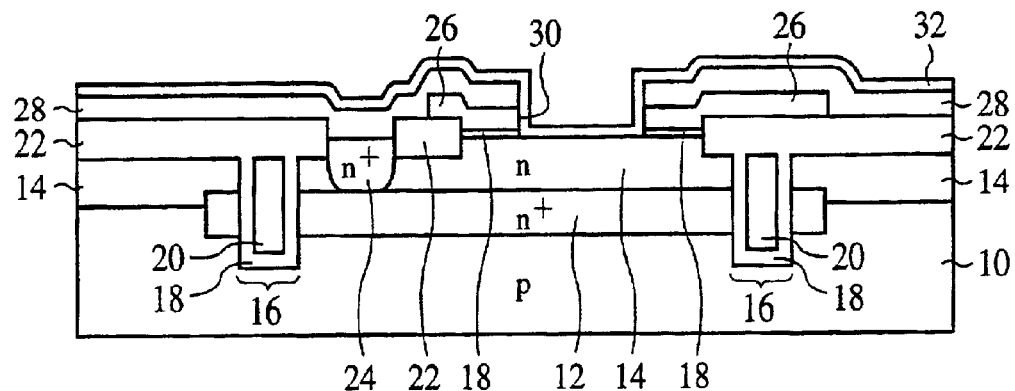
FIGS. 3A to 3C are sectional views of the semiconductor device according to the embodiment in the steps of the method for fabricating the semiconductor device, which show the method (Part 2).

Then, as shown in FIG. 3A, the insulation film 28, the outgoing base electrode 26 and the pad oxide film 18 are etched by photolithography to form the opening 30 down to the collector layer 14. The opening 30 is formed by, e.g., the following process.

First, the insulation film 28 and the outgoing base electrode 26 are dry-etched by photolithography. In this etching, the etching is stopped when the etching has etched off the outgoing base electrode 26 without etching the pad oxide film 18.

Then, the pad oxide film 18 is wet-etched. The pad oxide film 18 is etched by wet-etching not to damage the collector layer 14.

In etching the pad oxide film 18 it is preferably that the side etching of the pad oxide film 18 immediately below the outgoing base electrode 26 is, e.g., below 0.1 µm, whereby an intrinsic base region can be made small, and a parasitic capacitance between the base layer 32 and the collector layer 14 can be small.

Next, the 150 nm-thickness p type base layer 32 of carbon-content silicon germanium is formed on the entire surface by thermal CVD. A growth gas fed into the growth chamber when the base layer 32 is formed contains germanium by 20%, carbon by 0.4%, and boron by $5\times10^{18}$ cm$^3$. A composition of the growth gas is suitably set so as to obtain a required concentration profile.

The base layer 32 is grown single crystalline on the surface of the collector layer 14 in single crystalline state. On the part where the insulation film 28, the outgoing base electrode 26 and the pad oxide film 18 are exposed, the base layer 32 is grown polycrystalline.

In order to grow the base layer 32 single-crystalline on the surface of the collector layer 14 it is necessary to keep the surface of the collector layer 14 very clean without natural oxide films, etc. present thereon. In order to keep the surface of the collector layer 14 very clean, hydrogen gas is introduced into the growth chamber before the base layer 32 is grown, to thereby etch natural oxide films, etc. on the surface of the collector layer 14. In etching the natural oxide films, etc. on the surface of the collector layer 14 it must be noted that the pad oxide film 18 immediately below the outgoing base electrode 26 is not much side-etched.

Figure 3B:
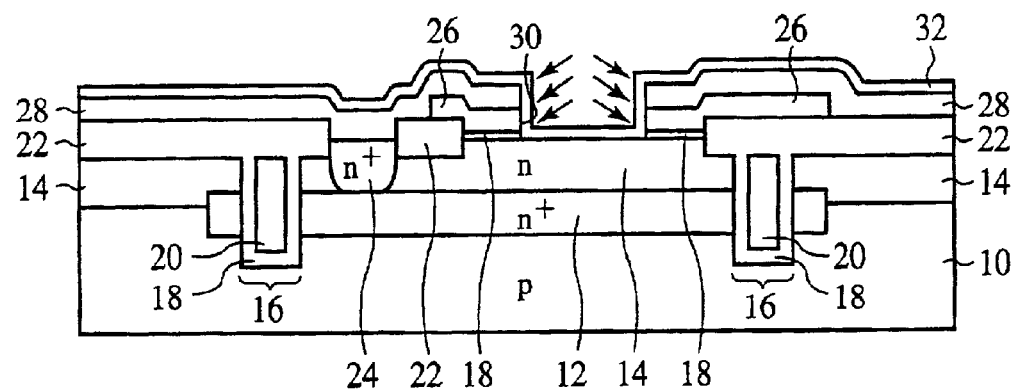

Then, as shown in FIG. 3B, ion implantation is performed obliquely to the substrate surface to thereby heavily implant a p type impurity into a region which includes the inside wall of the opening 30. An ion implantation angle is, e.g., about 45 degrees to the substrate surface. The ion implantation is performed obliquely to the substrate surface so as to heavily implant an impurity in the region which includes the inside wall of the opening 30 while not to introduce the impurity into the emitter layer 36, which will be formed in a later process.

The ion implantation into the left part of the inside wall of the opening 30 as viewed in the drawing is performed obliquely from the upper right as viewed in the drawing, and the ion implantation into the right part of the side wall of the opening 30 as viewed in the drawing is performed obliquely from the upper left as viewed in the drawing. Conditions for the ion implantation, specifically for BF$_2$ are 15 keV acceleration energy and a $3\times10^{15}$ cm$^{-2}$ dose.

An angle of the ion implantation is not limited to 45 degrees to the substrate surface and suitably set in consideration of a width, a depth, etc. of the opening 30. Acceleration energy and a dose may be suitably set in consideration of diffusion of the impurity due to heat processing, etc. in the later steps.

Figure 3C:
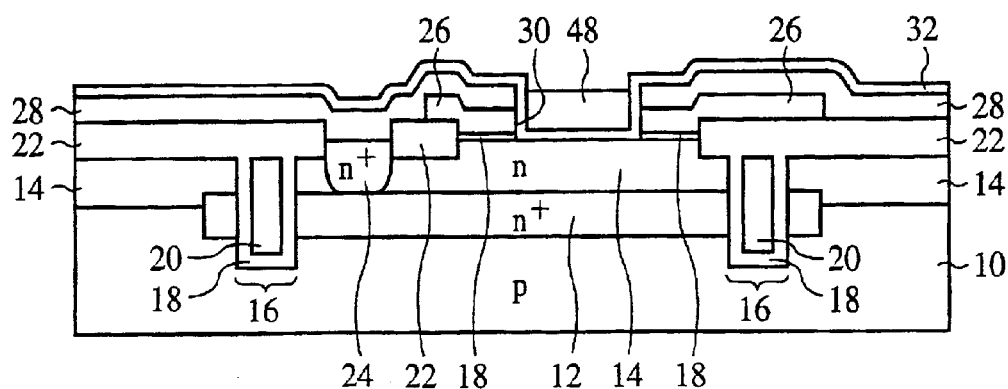

Then, as shown in FIG. 3C, a resist 48 is buried in the opening 30 with the base layer 32 formed in.

Figure 4A:
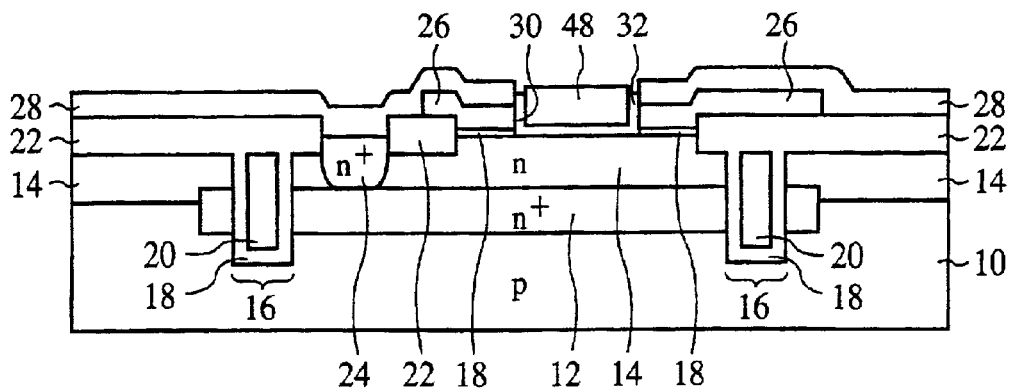
FIGS. 4A to 4C are sectional views of the semiconductor device according to the embodiment in the steps of the method for fabricating the semiconductor device, which show the method (Part 3).

Next, as shown in FIG. 4A, the base layer 32 is etched by reactive ion etching with the resist 48 as a mask. An etching gas is, e.g., a mixed gas of BCl$_3$ and Cl$_2$. The etching of the base layer 32 is stopped at a position upper of the upper surface of the outgoing base electrode 26. The etching of the base layer 32 is stopped at a position upper of the upper surface of the outgoing base electrode 26 because when the base layer 32 is etched downward beyond the upper surface of the outgoing base electrode 26, even the outgoing base electrode 26 is etched, with a result of increased parasitic resistance between the base layer 32 and the outgoing base electrode 26. In consideration of dispersion of the etching process it is preferable that the etching of the base layer 32 is stopped at a position which is upper of the upper surface of the outgoing base electrode 26 by, e.g., 0.02 µm.

Figure 4B:
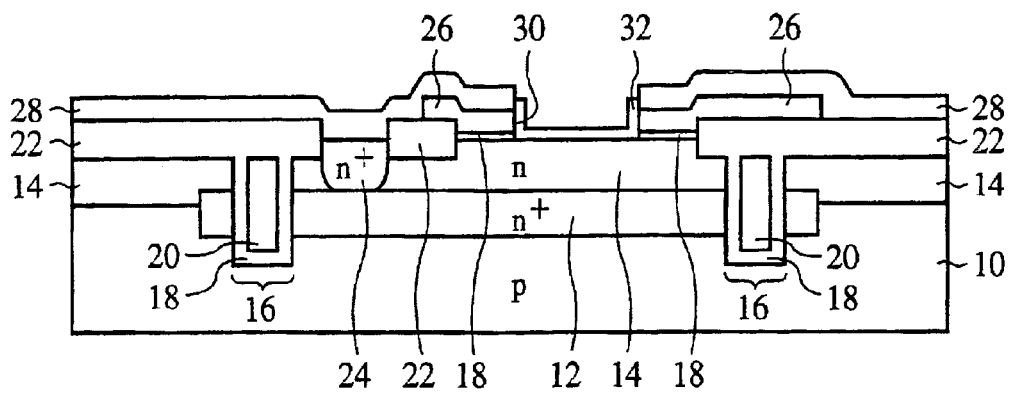

Then, as shown in FIG. 4B, the resist 48 is removed.

Next, a 100 nm-thickness silicon nitride film is formed by thermal CVD. The silicon nitride film is for forming the sidewall insulation film 34.

Figure 4C:
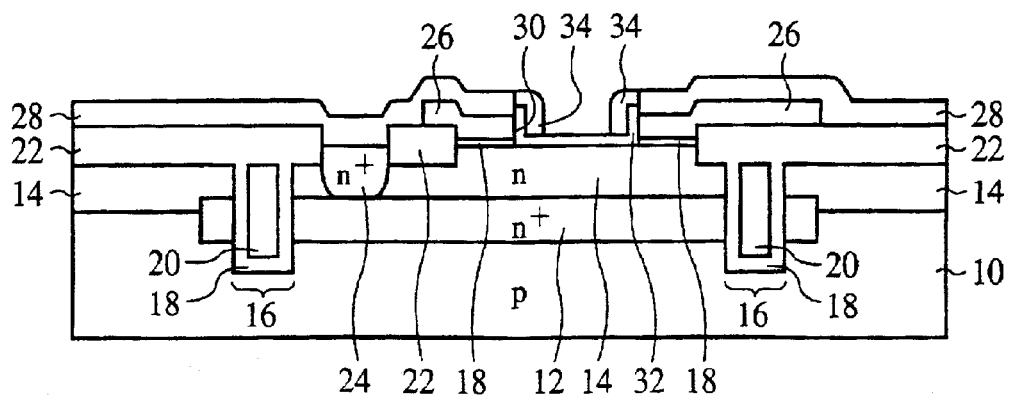

Then, the silicon nitride film is etched by anisotropic etching to thereby form the sidewall insulation film 34 of the silicon nitride film on the inside wall of the opening 30 where the base layer 32 is formed (see FIG. 4C).

Next, the emitter layer 36 is formed of n type amorphous silicon doped with a $3\times10^{20}$ cm$^{-3}$ concentration of As by thermal CVD.

Then, heat processing is made, e.g., at 900° C. for 10 seconds. Conditions for the heat processing are suitably so set that a required h$_{FE}$ can be obtained.

Figure 5A:
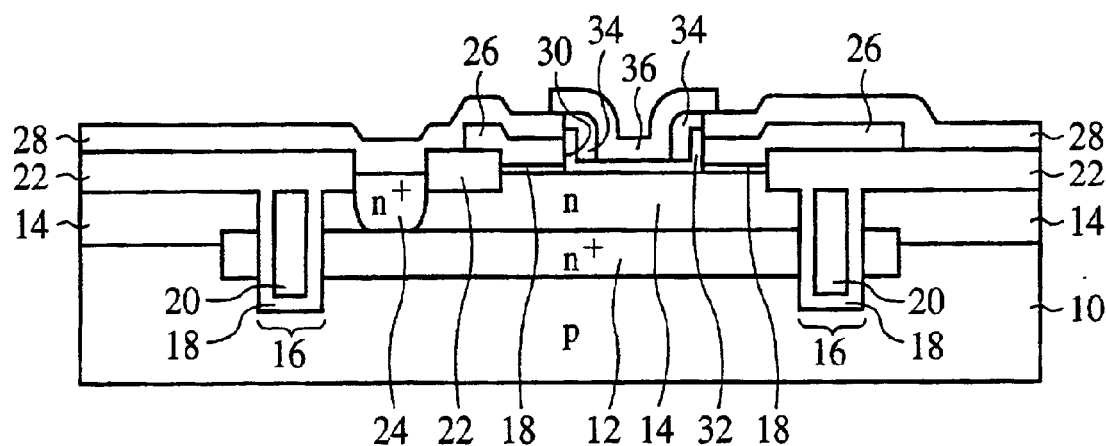
FIGS. 5A and 5B are sectional views of the semiconductor device according to the embodiment in the steps of the method for fabricating the semiconductor device, which show the method (Part 4).
Figure 5B:
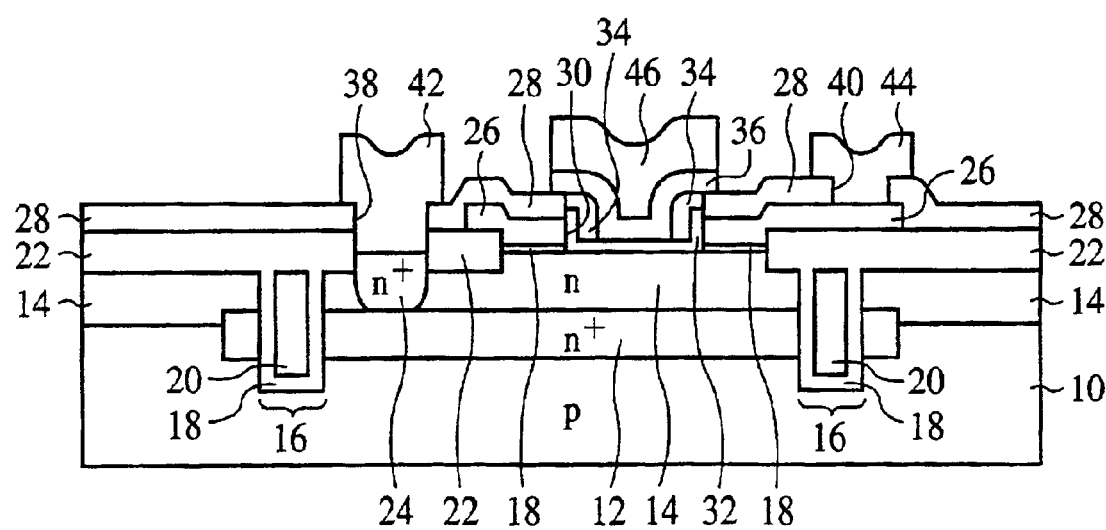

Then, the emitter layer 36 is patterned by photolithography (see FIG. 5A).

Next, an opening 38 and an opening 40 are formed respectively down to the collector compensation diffused layer 24 and down to the outgoing base electrode 26.

Then, a 100 nm-thickness TiN film and a 1 µm-thickness Al film are sequentially formed by sputtering.

Next, the Al film and the TiN film are patterned by photolithography to form the collector electrode 42, the emitter electrode 46 and the base electrode 44.

Thus, the semiconductor device according to the present embodiment is thus fabricated.

(Evaluation Result)

Figure 6:
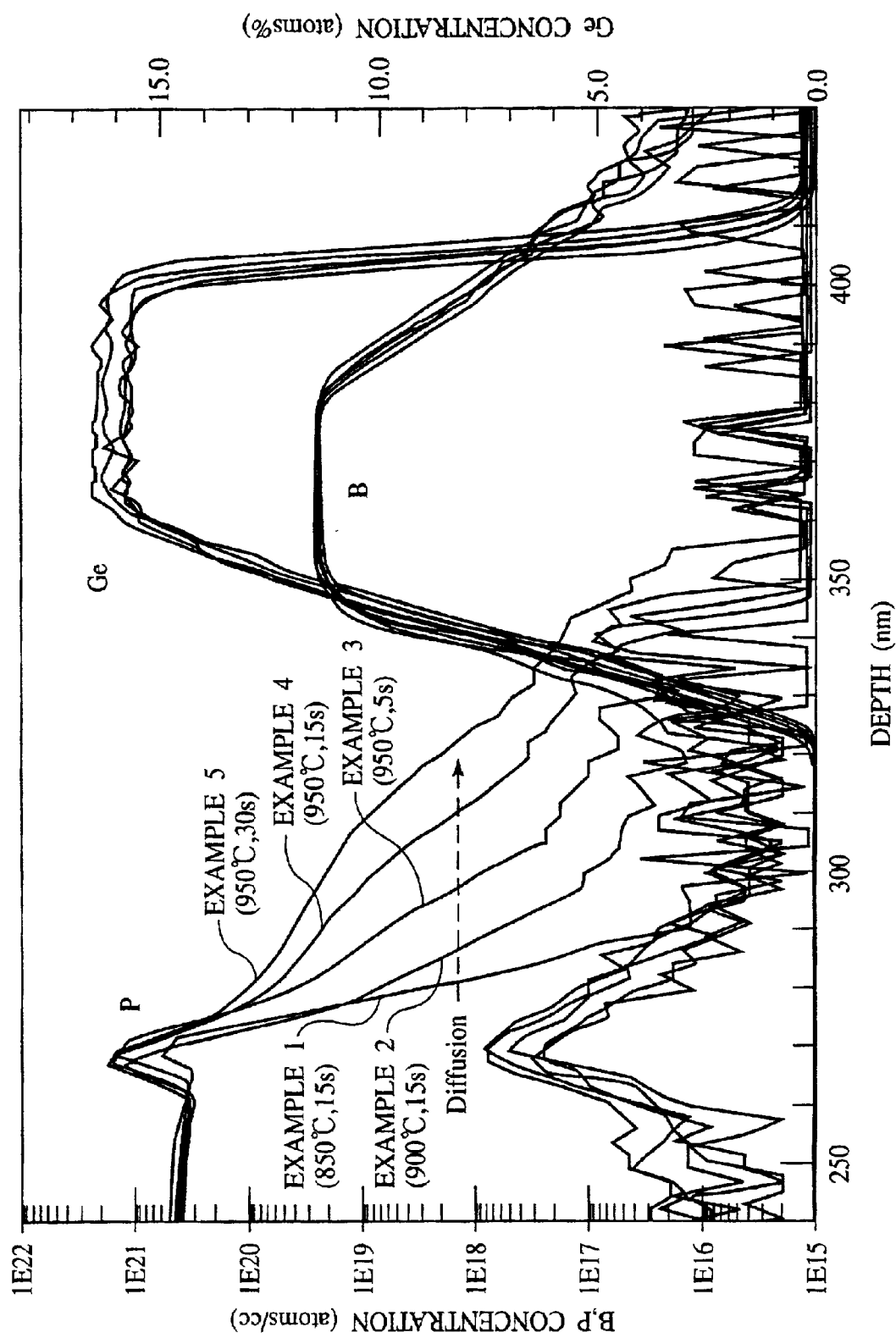
FIG. 6 is a graph of concentration profiles of respective atoms for different heat processing conditions.
Figure 7:
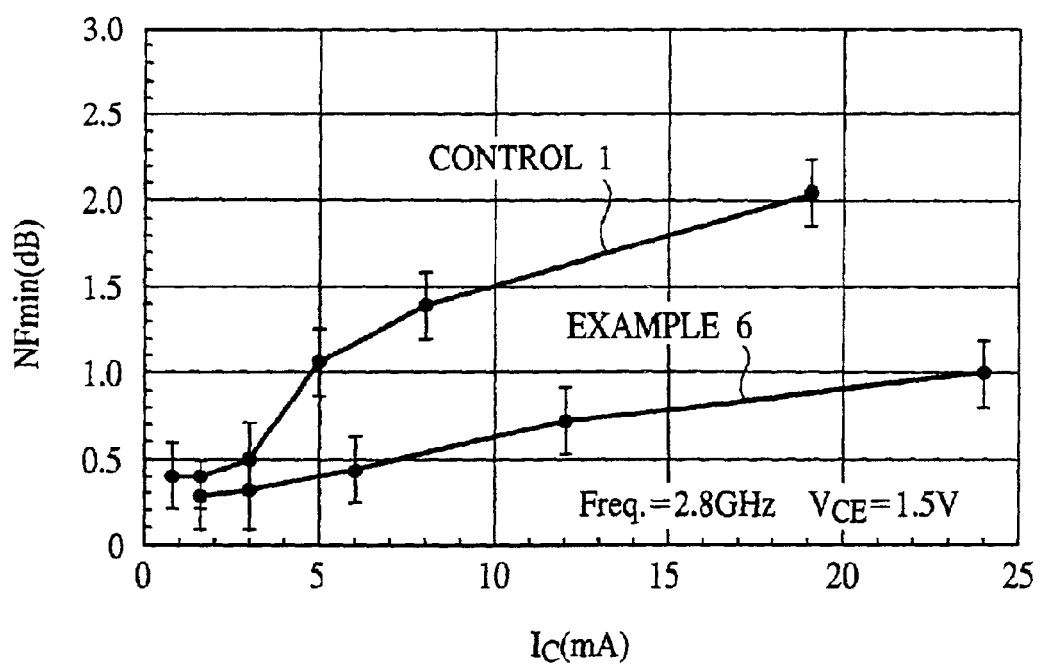
FIG. 7 is a graph of results of measured noise figures.

Evaluation results of the semiconductor device according to the present embodiment will be explained with reference to FIGS. 6 and 7. FIG. 6 is a graph of concentration profiles of respective atoms for different heat processing conditions. FIG. 7 is a graph of results of measured noise figures.

The results of evaluation of the diffusion of boron in the base layer will be explained with reference to FIG. 6.

In FIG. 6, Example 1 is a concentration profile for heat processing conditions of 850° C. and 15 seconds, and Example 2 is a concentration profile for heat processing conditions of 900° C. and 15 seconds. Example 3 is a concentration profile for heat processing conditions of 950° C. and 5 seconds, Example 4 is a concentration profile for heat processing conditions of 950° C. and 15 seconds, and Example 5 is a concentration profile for heat processing conditions of 950° C. and 30 seconds. In the respective examples, the base layer 32 had a composition of germanium by 20% and carbon by 0.4% and had a $1 \times 10^{18}$ cm$^{-3}$ boron concentration.

As seen in FIG. 6, the phosphorus (P) in the emitter layer 36 had different concentrations corresponding to the changes of the heat processing conditions. Based on this, it is found that the phosphorus in the emitter layer 36 was diffused by the heat processing.

On the other hand, the boron (B) and the germanium (Ge) in the base layer 32 had substantially no change corresponding to the heat processing changes. Based on this, it is found that the boron and the germanium in the base layer 32 were not diffused by the heat processing. That is, in the present embodiment, a material of the base layer is silicon germanium containing carbon by 0.01% to 6%, whereby the boron is prevented from being diffused out of the base layer 32.

Based on this, the semiconductor device according to the present embodiment can have high operational speed.

Then, results of evaluating noise figures will be explained with reference to FIG. 7.

In FIG. 7, collector currents $I_C$ are taken on the horizontal axis, and noise figure NF$_{min}$ are taken on the vertical axis. Measuring conditions were 2.0 GHz operational frequency and 1.5 volt $V_{CE}$.

Example 6 indicates noise figures of the semiconductor device according to the present embodiment. Control 1 indicates noise figures of the proposed semiconductor device described above.

Near 5 mA, which is the practical collector current region of the low noise amplifier, Control 1, i.e., the proposed semiconductor device has an about 1.0 dB noise figure. Example 6, i.e., the semiconductor device according to the present embodiment had an about 0.4 dB noise figure, which is much decreased.

Based on this, the semiconductor device according to the present embodiment can have low noises.

(Modification (Part 1))

Figure 8A:
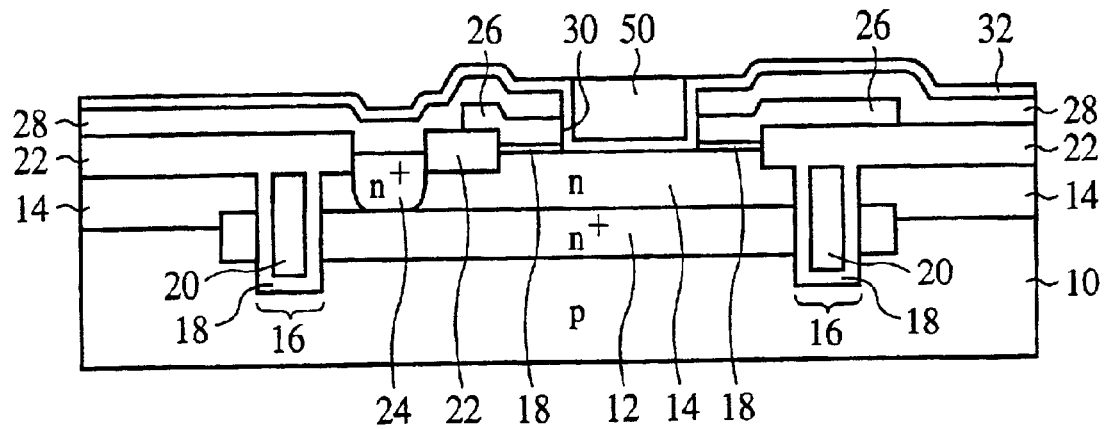
FIGS. 8A and 8B are sectional views of the semiconductor device according to a modification (Part 1) of the embodiment of the present invention in the steps of the method for fabricating the same, which explain the method.
Figure 8B:
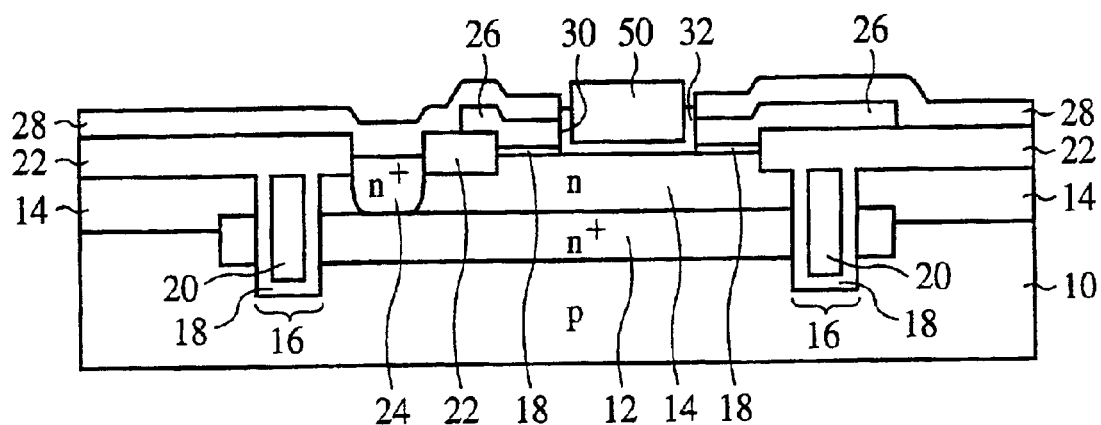

Next, a modification (Part 1) of the method for fabricating the semiconductor device according to the present embodiment will be explained with reference to FIGS. 8A and 8B. FIGS. 8A and 8B are sectional views of the semiconductor device according to the modification in the steps of the method for fabricating the modification, which show the method.

The modification of the method for fabricating the semiconductor device according to the present embodiment is characterized mainly in that a mask material 50 is buried in the opening 30 by CMP, and with the mask material 50 as a mask, the base layer 32 is etched.

The steps described above with reference to FIGS. 2A to 3B are the same as the steps of the method according to the present modification, and their explanation will not be repeated.

Next, as shown in FIG. 8A, a mask material 50 of, e.g., PSG is buried by CMP in the opening 30 with the base layer 32 formed in.

Then, as shown in FIG. 8B, with the mask material 50 as a mask, the base layer 32 is etched. In this etching, the etching of the base layer 32 is stopped at a position which is upper of the upper surface of the outgoing base electrode 26. Specifically, the etching of the base layer 32 is stopped at a position which is upper of the upper surface of the outgoing base electrode 26 by, e.g., above 0.02 μm. For such etching, an etching amount of the base layer 32 is set to be, e.g., about 0.1 μm.

A mask material is thus buried in the opening by CMP, and with the mask material as a mask, the base layer may be etched.

(Modification (Part 2))

Figure 9:
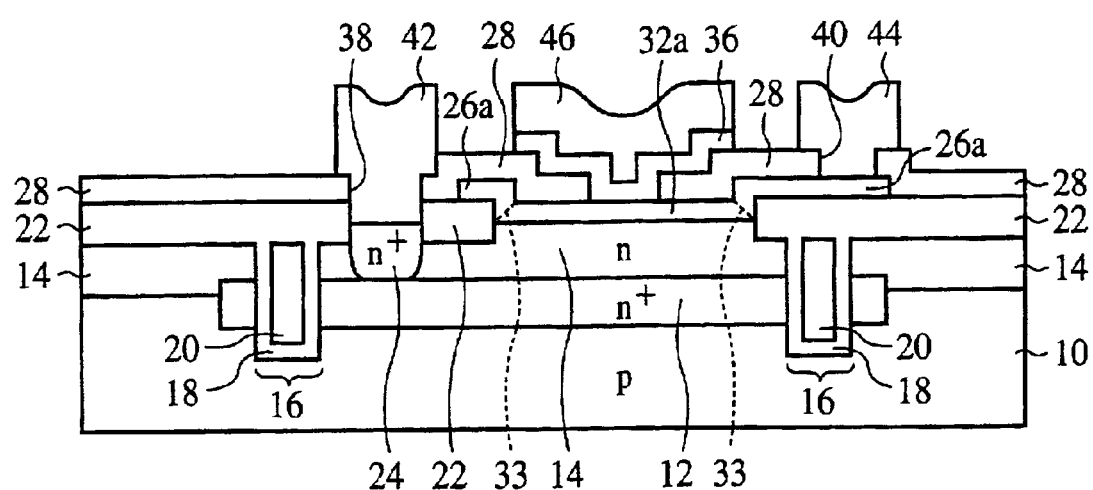
FIG. 9 is a sectional view of the semiconductor device according to a modification, (Part 2) of the embodiment of the present invention.
Figure 10A:
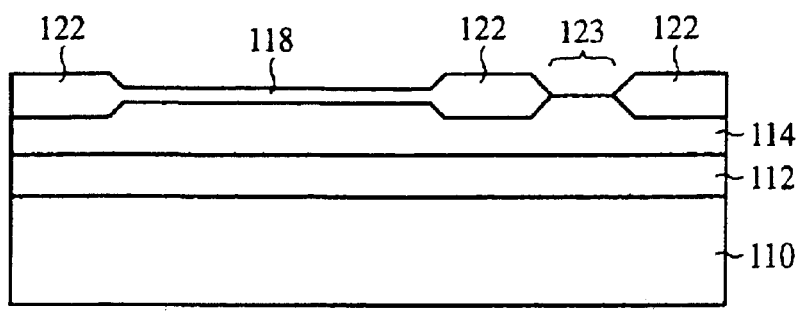
FIGS. 10A to 10D are sectional views of the proposed HBT in the steps of the method for fabricating the proposed HBT, which show the method (Part 1).
Figure 10B:
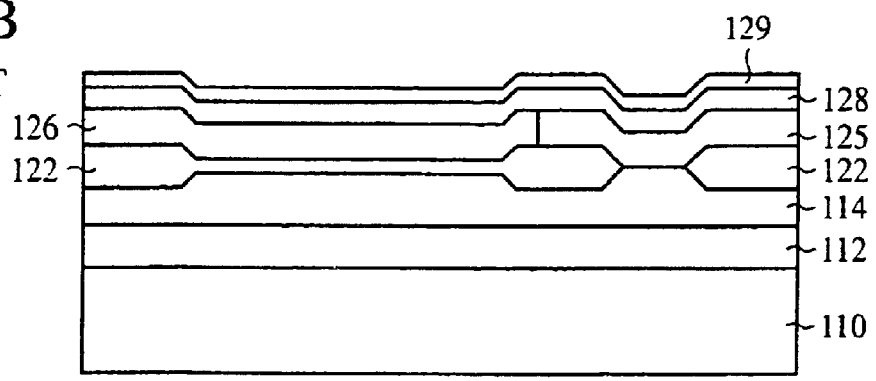
Figure 10C:
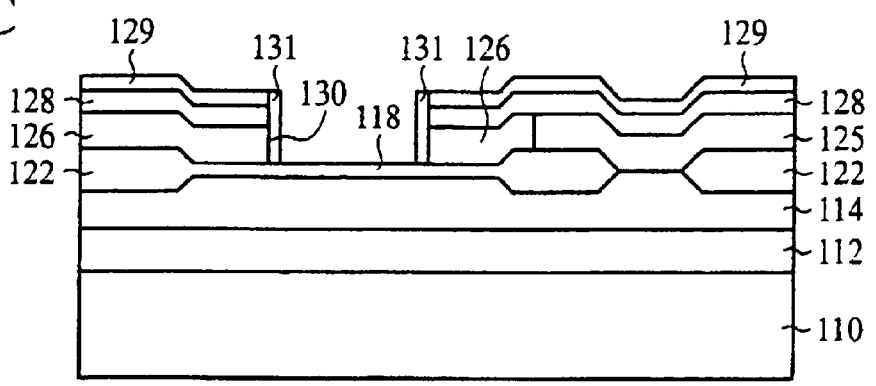
Figure 10D:
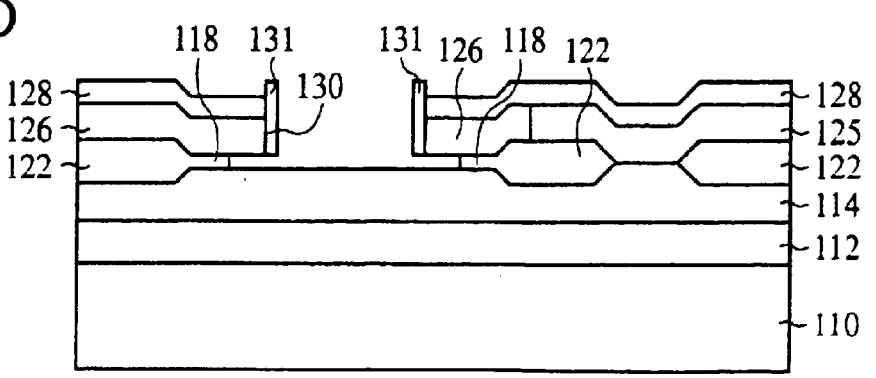
Figure 11A:
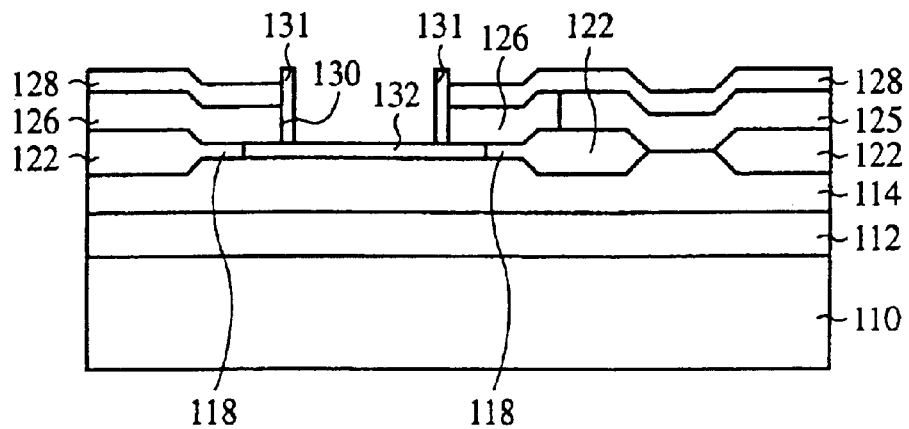
FIGS. 11A to 11C are sectional views of the proposed HBT in the steps of the method for fabricating the proposed HBT, which show the method (Part 2).
Figure 11B:
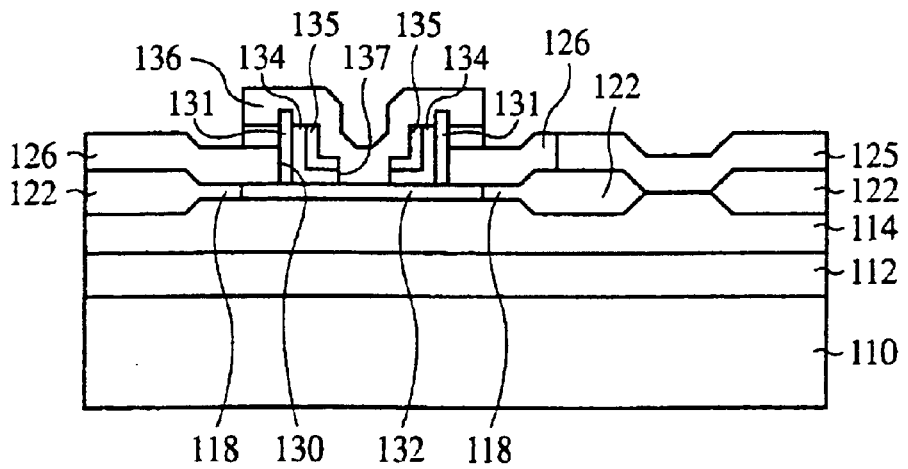
Figure 11C:
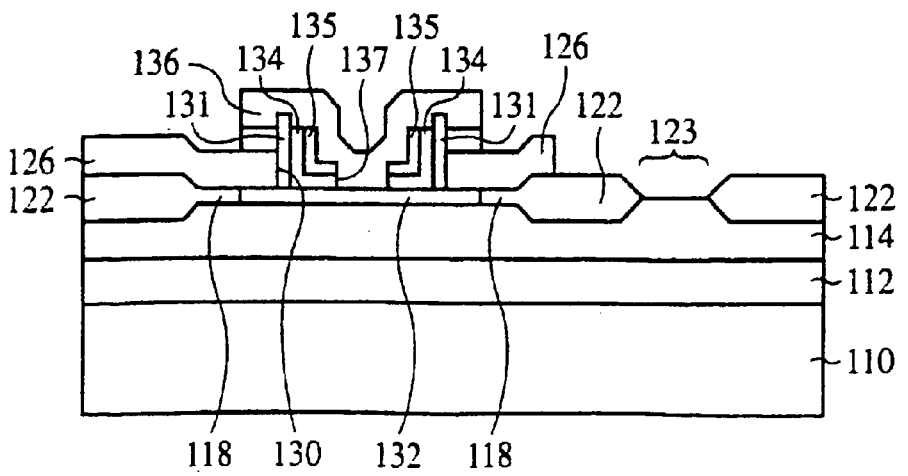

Next, a modification (Part 2) of the semiconductor device according to the present embodiment will be explained with reference to FIG. 9. FIG. 9 is a sectional view of the semiconductor device according to the present modification.

The semiconductor device according to the present modification is characterized mainly in that an outgoing base electrode and a base layer are formed continuous to each other.

In the semiconductor device shown in FIG. 1, the outgoing base electrode 26 and the base layer 32 are formed separate from each other, but in the present modification, the outgoing base electrode 26a and the base layer 32a are formed continuous to each other.

The base layer 32a is single-crystalline. The base layer 32a is formed of silicon germanium containing carbon, as is the base layer 32 of the semiconductor device shown in FIG. 1.

The outgoing base electrode 26a is polycrystalline. The outgoing base electrode 26a is formed of p type polycrystal silicon, as it the outgoing base electrode 26 of the semiconductor device according to the first embodiment.

An impurity is heavily doped in the interface, i.e., the junction, between the base layer 32a and the outgoing base electrode 26a. An impurity to be doped in the interface between the base layer 32a and the outgoing base electrode 26a is, e.g., boron.

In the case where the base layer and the outgoing base electrode are formed simply continuous to each other, a parasitic resistance in the interface, i.e., the junction, between the base layer and the outgoing base electrode becomes high, which makes noises large. However, according to the present modification, an impurity is heavily doped in the connection between the base layer 32a and the outgoing base electrode 26a, whereby a parasitic resistance in the junction 33 between the base layer 32a and the outgoing base electrode 26a can be depressed low.

Thus, according to the present modification, even in the case where the base layer 32a and the outgoing base electrode 26a are formed continuous to each other, the semiconductor device can have small noises.

The semiconductor device according to the present modification can be fabricated with the base layer 32a and the outgoing base electrode 26a formed not separate from each other but continuous to each other.

[Modification]

The present invention is not limited to the above-described embodiment and can cover other various modifications.

For example, the material of the base layer had one composition, but the base layer may not have one composition. For example, the base layer may have a sandwich structure having a carbon-content silicon germanium layer interposed.

In the above-described embodiment, ion implantation is performed obliquely to the substrate surface to thereby introduce a high concentration of an impurity into the interface between the base layer and the outgoing base electrode. However, a high concentration of an impurity may be introduced into the interface between the base layer and the outgoing base electrode by another means. For example, it is possible that a film containing an impurity, i.e., an impurity-content film is formed on the inside wall of the opening with the base layer formed on the inside surface, and then is heat processed to thereby diffuse the impurity in the impurity-content film into the interface between the base layer and the outgoing base electrode.

In the above-described embodiment, boron is used in the ion implantation diagonal to the substrate surface, but boron is not essential. Other p type impurities may be used.

In the above-described embodiment, as shown in FIG. 3B, the ion implantation is performed obliquely to the substrate surface with the base layer 32 formed on the entire surface. Before the emitter layer 36 is formed, the ion implantation may be performed in any step.

The technique of making a parasitic resistance low in the interface on the side wall by the diagonal ion-implantation can be useful for all the other devices, e.g., p type epitaxial base transistors, etc. containing no germanium.

The present embodiment has been described by means of HBT. However, the present embodiment is applicable to composite integrated circuits, such as BiCMOS, etc., including the above-described HBT as a constituent member.

The above-described embodiment has been explained by means of the npn type transistor. However, the conduction type is reversed to be applied pnp type transistors.

What is claimed is:

1. A semiconductor device comprising:
   a first semiconductor layer formed over a semiconductor substrate;
   an outgoing base electrode formed over the first semiconductor layer with an insulation film therebetween;
   a base layer formed in a base region on the first semiconductor layer, covering a side surface of the outgoing base electrode, connected to the outgoing base electrode at the side surface of the outgoing base electrode, and formed of silicon germanium containing carbon; and
   a second semiconductor layer formed on the base layer,
   wherein only the base layer is connected to the first semiconductor layer in the base region.

2. A semiconductor device comprising:
   a first semiconductor layer formed over a semiconductor substrate;
   an outgoing base electrode formed over the first semiconductor layer;
   a base layer formed in a base region on the first semiconductor layer, connected to the outgoing base electrode, and formed of silicon germanium containing carbon; and
   a second semiconductor layer formed on the base layer,
   the outgoing base electrode and the base layer are formed continuous to each other,
   wherein only the base layer is connected to the first semiconductor layer in the base region.

3. A semiconductor device according to claim 1, wherein the base layer contains carbon by 0.01% to 6%.

4. A semiconductor device according to claim 2, wherein the base layer contains carbon by 0.01% to 6%.

5. A semiconductor device comprising:
   a first semiconductor layer formed over a semiconductor substrate;
   an outgoing base electrode formed over the first semiconductor layer with an insulation film therebetween;
   a base layer formed on the first semiconductor layer, covering a side surface of the outgoing base electrode, connected to the outgoing base electrode at the side surface of the outgoing base electrode, and formed of silicon germanium containing carbon; and
   a second semiconductor layer formed on the base layer,
   wherein a dopant concentration of the base layer at the part connected to the outgoing base electrode is higher than a dopant concentration of the base layer immediately below the second semiconductor layer.

6. A semiconductor device comprising:
   a first semiconductor layer formed over a semiconductor substrate;
   an outgoing base electrode formed over the first semiconductor layer;
   a base layer formed on the first semiconductor layer, covering a side surface of the outgoing base electrode, connected to the outgoing base electrode at the side surface of the outgoing base electrode, and formed of silicon germanium containing carbon; and
   a second semiconductor layer formed on the base layer,
   the outgoing base electrode and the base layer are formed continuous to each other,
   wherein a dopant concentration of the base layer at the part connected to the outgoing base electrode is higher than a dopant concentration of the base layer immediately below the second semiconductor layer.

7. A semiconductor device according to claim 1, wherein side-etching of an insulation film immediately below the outgoing base electrode is below 0.1 $\mu$m.

8. A semiconductor device according to claim 2, wherein side-etching of an insulation film immediately below the outgoing base electrode is below 0.1 $\mu$m.

9. A semiconductor device according to claim 1, wherein the base layer is projected upward beyond the upper surface of the outgoing base electrode by above 0.02 $\mu$m.

10. A semiconductor device according to claim 2, wherein the base layer is projected upward beyond the upper surface of the outgoing base electrode by above 0.02 $\mu$m.

11. A semiconductor device according to claim 1, wherein the first semiconductor layer is a collector layer; and the second semiconductor layer is an emitter layer.

12. A semiconductor device according to claim 2, wherein the first semiconductor layer is a collector layer; and the second semiconductor layer is an emitter layer.

13. A method for fabricating a semiconductor device comprising the steps of:
   forming a first semiconductor layer over a semiconductor substrate;
   forming an insulation film on the first semiconductor layer;
   forming on the insulation film an outgoing base electrode with an opening reached to the first semiconductor layer;
   forming a base layer of silicon germanium containing carbon at least in the opening, the base layer covering a side surface of the outgoing base electrode, only the base layer being connected to the first semiconductor layer in a base region; and forming a second semiconductor layer on the base layer.

14. A method for fabricating a semiconductor device according to claim 13, wherein the step of forming the base layer includes the step of forming a carbon-content silicon germanium layer in the opening and over the outgoing base electrode; the step of burying a mask material in the opening with the carbon-content silicon germanium layer; and the step of etching the carbon-content silicon germanium layer with the mask material as a mask.

15. A method for fabricating a semiconductor device comprising the steps of:

forming a base layer of silicon germanium containing carbon and an outgoing base electrode connected to the base layer over a first semiconductor layer formed over a semiconductor substrate, the base layer and the outgoing base electrode being formed continuous to each other, only the base layer being connected to the first semiconductor layer in a base region; and forming a second semiconductor layer on the base layer.

16. A method for fabricating a semiconductor device comprising the steps of:

forming a first semiconductor layer over a semiconductor substrate;

forming an insulation film on the first semiconductor layer;

forming on the insulation film an outgoing base electrode with an opening reaching to the first semiconductor layer;

forming a base layer of silicon germanium containing carbon at least in the opening, the base layer covering a side surface of the outgoing base electrode;

forming a second semiconductor layer on the base layer, and further comprising the step of implanting a dopant in the interface between the base layer and the outgoing base electrode.

17. A method for fabricating a semiconductor device comprising the steps of:

forming an outgoing base electrode with an opening formed over a first semiconductor layer formed over a semiconductor substrate;

forming a base layer of silicon germanium containing carbon at least in the opening, the base layer covering a side surface of the outgoing base electrode; and forming a second semiconductor layer on the base layer, wherein the step of forming the base layer includes the step of forming a carbon-content silicon germanium layer in the opening and over the outgoing base electrode; the step of burying a mask material in the opening with the carbon-content silicon germanium layer with the mask material as a mask, and further comprising the step of implanting a dopant in the interface between the base layer and the outgoing base electrode.

18. A method for fabricating a semiconductor device comprising the steps of:

forming a base layer of silicon germanium containing carbon and an outgoing base electrode connected to the base layer over a first semiconductor layer formed over a semiconductor substrate, the base layer and the outgoing base electrode being formed continuous to each other;

forming a second semiconductor layer on the base layer, and further comprising the step of implanting a dopant in the interface between the base layer and the outgoing base electrode.

19. A method for fabricating a semiconductor device according to claim 16, wherein in the step of implanting a dopant, the dopant is implanted obliquely to the surface of the semiconductor substrate.

20. A method for fabricating a semiconductor device according to claim 17, wherein in the step of implanting a dopant, the dopant is implanted obliquely to the surface of the semiconductor substrate.

21. A semiconductor device according to claim 1 wherein the base layer is formed by implanting an impurity into a portion of the base layer.

* * * * *